United States Patent
Hasegawa et al.

(10) Patent No.: US 6,717,218 B2
(45) Date of Patent: Apr. 6, 2004

(54) WIRING STRUCTURE FORMED IN CONTACT HOLE, MANUFACTURING METHOD THEREFOR, AND A DISPLAY APPARATUS HAVING THE SAME

(75) Inventors: Isao Hasegawa, Gifu (JP); Koji Suzuki, Aichi (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 10/378,907

(22) Filed: Mar. 5, 2003

(65) Prior Publication Data

US 2003/0170433 A1 Sep. 11, 2003

(30) Foreign Application Priority Data

Mar. 5, 2002 (JP) ........................................ 2002-059151

(51) Int. Cl.[7] .............................................. H01L 27/01
(52) U.S. Cl. ..................... 257/350; 428/209; 428/620
(58) Field of Search ............................ 257/350; 428/901, 428/209, 620

(56) References Cited

U.S. PATENT DOCUMENTS

| 6,093,934 A | * | 7/2000 | Yamazaki et al. | ............. 257/51 |
| 6,124,604 A | * | 9/2000 | Koyama et al. | ............... 257/72 |
| 6,281,552 B1 | * | 8/2001 | Kawasaki et al. | ........... 257/350 |

FOREIGN PATENT DOCUMENTS

| JP | 61-138259 | 8/1986 |
| JP | 63-250873 | 10/1988 |
| JP | 5-249916 | 9/1993 |
| JP | 08-54836 | 2/1996 |
| JP | 08-129358 | 5/1996 |
| JP | 10-319872 | 12/1998 |
| JP | 11-219146 | 8/1999 |
| JP | 11-260562 | 9/1999 |
| JP | 2000-221903 | 8/2000 |
| JP | 2001-60076 | 3/2001 |
| JP | 2001-282136 | 10/2001 |
| WO | WO98/36407 | 8/1998 |

OTHER PUBLICATIONS

"Al–Mo (Aluminum–Molybdenum)" L.Brewer et al., *Binary Alloy Phase Diagrams* vol. 1 ed. Thaddeus B. Massalski, (Dec. 1980) pp. 133–134.

* cited by examiner

Primary Examiner—Cathy Lam
(74) Attorney, Agent, or Firm—McDermott, Will & Emery

(57) ABSTRACT

A contact hole is formed, by etching that uses buffered hydrofluoric acid, in a gate insulating film made of $SiO_2$ and an interlayer insulating layer, formed on the gate insulating film, which is made of SiN. In this contact hole, there is formed an electrode which includes: a first protective metal layer made of a refractory metal; a wiring layer, formed on the first protective metal layer, which is made of a metal whose resistance is lower than that of the refractory metal; and a second protective metal layer, made of a refractory metal, which is formed thicker than the gate insulating film.

21 Claims, 6 Drawing Sheets

WIRING STRUCTURE FORMED IN CONTACT HOLE, MANUFACTURING METHOD THEREFOR, AND A DISPLAY APPARATUS HAVING THE SAME

BACKGROUND OF THE INVENTION

1. Field of the Invention

The present invention relates to a layered structure of wire(s), a manufacturing method therefor, and a display apparatus including the layered structure of wire(s).

2. Description of the Related Art

Display apparatus using thin film transistors (hereinafter simply referred to as TFTs) as switching elements have been on the market these days. Recently organic electroluminescent (EL) display apparatus employing current-driven type organic light emitting diodes (hereinafter also referred to as OLED) that function as luminous elements are attracting attention as display apparatus to replace CRTs and LCDs. In display apparatus using organic electroluminescent (EL) elements, the TFTs are used also to drive the organic EL elements.

FIG. 5 is a cross-sectional view of a TFT in a display apparatus using an organic EL element. A TFT 200 has a stacked structure in the order of an insulating substrate 210 which is made of quartz glass or the like, an active layer 243 which is made of a polycrystalline silicon, a gate insulating film 212 which is made of $SiO_2$ (silicon oxide), and a gate electrode 242 which is made of a refractory metal such as molybdenum (Mo). The active layer 243 is provided with a channel 243c below the gate electrode 242 and a drain 243d and a source 243s, both formed by ion injection with the gate electrode 242 as a mask, on both sides of the channel 243c.

The TFT 200 further includes an interlayer insulating film 215 which comprises a first interlayer insulating film 213 made of SiN and a second interlayer insulating film 214 made of $SiO_2$, a drain electrode 253 and a source electrode 254. The drain electrode 253 and the source electrode 254 are formed by filling aluminum (Al) or like metal in the contact holes provided corresponding to the drain 243d and the source 243s, respectively. The contact holes to be used in forming the drain electrode 253 and the source electrode 254 are formed by etching with buffered hydrofluoric acid or the like.

In the TFT 200 structured as described above, however, the first interlayer insulating film 213 is made of SiN which has a lower etching rate than $SiO_2$ that constitutes the gate insulating film 212 therebelow when using buffered hydrofluoric acid. Thus, if the contact holes are formed by wet etching using the buffered hydrofluoric acid, an overhang, where more of the gate insulating film 212 is etched as shown in FIG. 6A, will be formed at the boundary between the gate insulating film 212 and the first interlayer insulating film 213. The formation of an overhang like this may cause a problem of increased contact resistance due to a level difference between the drain electrode 253 and the source electrode 254, which are formed by their respective contact holes.

With display apparatus using organic EL elements, on the other hand, the driver TFTs including layered structure of wire(s) which serves as a power supply line for the organic EL elements are required to have higher reliability, which is to be realized by such measures as lowering resistance, reducing whiskers and hillocks or eliminating electromigration or stressmigration. To lower the resistance, the drain electrode 253 and the source electrode 254 are structured of a low-resistance metal such as the above-mentioned aluminum. Moreover, whiskers and hillocks are reduced by providing a protective metal layer made of a refractory metal such as molybdenum, in such a manner as to cover the wiring layer made of a low-resistance metal such as aluminum. The protective metal layer like this is formed thinner than the wiring layer made of a low-resistance metal in order to reduce the resistance of the layered structure of wire(s) as a whole and to reduce the unevenness of the panel surface.

When the drain electrode 253 and the source electrode 254 are formed of a wiring layer of a low-resistance metal and a protective metal layer, there may arise a problem of the protective metal layer severed due to a level difference created by the overhang formed in the contact hole as shown in FIG. 6B. Moreover, as illustrated therein, a whisker may result at the severed portion. In particular, since the cathode of an organic EL element is formed all above the drain electrode 253 and the source electrode 254, the whisker sprouting on the upper protective metal layer will cause a short circuit between these electrodes and the cathode of the organic EL element, thus rendering the display apparatus defective.

SUMMARY OF THE INVENTION

The present invention has been made in view of the foregoing circumstances and an object thereof is to provide a layered structure of wire(s) capable of reducing the occurrence of defective display apparatus by preventing a short circuit between electrodes. Another object of the present invention is to reduce the occurrence of whiskers in the layered structure of wire(s). Still another object of the present invention is to lower the resistance of the layered structure of wire(s).

According to the present invention, there is provided a layered structure of wire(s) provided in a contact hole formed in an insulating film in which a first insulating layer and a second insulating layer made of different material from each other are stacked in this order, and this layered structure of wire(s) includes: a first metal layer which is made of a refractory metal; a wiring layer, formed on the first metal layer, which is made of a metal whose resistance is lower than that of the refractory metal; and a second metal layer, formed on the wiring layer, which is made of a refractory metal and is thicker than the first insulating layer.

By forming the second metal layer thicker than the first insulating layer, it is possible that the second metal layer is formed without the occurrence of any severance even when an overhang is formed at a boundary between the first and second insulating layers at the contact hole. As a result, the formation of whiskers on the second metal layer can be prevented, so that no short circuit is caused between this layered structure of wire(s) and other electrodes.

The first insulating layer may be made of $SiO_2$ or SiON. Moreover, the second insulating layer may be made of SiN.

As the refractory metal, metal including a group 6A element such as molybdenum (Mo), chromium (Cr) or tungsten (W), for example, may be used. Provision of such a metal layer can contribute to reducing the occurrence of whiskers and hillocks in an interconnection structure. Moreover, these group 6A elements are characterized in that they exhibit less diffusion against the low-resistance metal. Furthermore, tantalum (Ta), vanadium (V) or niobium (Nb) may be used as the refractory metal. It is preferable that the refractory metal includes the molybdenum. In particular, the molybdenum can be processed with ease in its manufacturing process.

As a metal that constitutes the wiring layer, aluminum (Al), copper (Cu), silver (Ag), gold (Au), rhodium (Rh), iridium (Ir), nickel (Ni), platinum (Pt) or palladium (Pd) may be used, for example. The layered structure of wire(s) can be made low-resistant by using these metals as above. Among these metals, aluminum in particular, copper or silver whose resistivity is lower than that of aluminum is preferably used. It is particularly preferable that the wiring layer be made of metal including aluminum. Thereby, the adhesion of aluminum with the metal layer made of the refractory metal is enhanced because reactivity of aluminum is high, thus contributing to the improvement of a yield of the layered structure of wire(s).

According to the present invention, there is provided a layered structure of wire(s) provided in a contact hole formed in an insulating film in which a first insulating layer and a second insulating layer made of different material from each other are stacked in this order, and the layered structure of wire(s) includes: a first metal layer which is made of a refractory metal; a wiring layer, formed on the first metal layer, which is made of a metal whose resistance is lower than that of the refractory metal; and a second metal layer, formed on the wiring layer, which is made of a refractory metal and is so formed as to be thicker than a distance between an overhang and the first insulating layer therebelow, wherein the contact hole is formed by using a predetermined etchant, and in the second insulating film there is formed the overhang which is protruded beyond the first insulating film toward the center of the contact hole.

By forming the second metal layer thicker than the distance between the overhang formed on the second insulating film at the contact hole and the first insulating film therebelow, it is possible that the second metal layer is formed without the occurrence of any severance since the effect of the overhang will be thus absorbed. Thus, the formation of whiskers on the second metal layer can be prevented, so that no short circuit is caused between this layered structure of wire(s) and other electrodes. It is to be understood that the second metal layer in this case can be formed thicker than the distance between a tip of the overhang and the first insulating film therebelow.

A buffered hydrofluoric acid may be used as the predetermined etchant.

According to the present invention, there is provided a layered structure of wire(s) provided in a contact hole formed in an insulating film in which a first insulating layer and a second insulating layer made of different material from each other are stacked in this order, and the layered structure of wire(s) includes: a first metal layer which is made of a refractory metal; a wiring layer, formed on the first metal layer, which is made of a metal whose resistance is lower than that of the refractory metal; and a second metal layer, formed on the wiring layer, which is made of a refractory metal and is formed to have thickness such that any severance does not occur due to a level difference caused by different etching rates of the first insulating layer and the second insulating layer when using a predetermined etchant, wherein the contact hole is formed by using the predetermined etchant.

By forming the second metal layer accordingly, it is possible that the second metal layer is formed without the occurrence of any severance. Thus, the formation of whiskers on the second metal layer can be prevented, so that no short circuit is caused between this layered structure of wire(s) and other electrodes.

The contact hole may be formed in such a manner that the second insulating layer has a taper slower than that of the first insulating layer.

By forming the taper of the second insulating layer slower than that of the first insulating layer, the effect of the overhang can be reduced, so that the thickness of the second metal layer can be made smaller. Thus, the layered structure of wire(s) can be made low-resistant.

The insulating film may further include a third insulating layer, formed on the second insulating layer, which is made of material whose etching rate is greater than that of the second insulating layer when using the predetermined etchant. In a case when the second insulating layer is SiN, the third insulating layer may be made of $SiO_2$ or SiON. By providing another insulating layer such as the third insulating layer described above, the third insulating layer is etched faster than the second insulating layer during etching, so that the second insulating layer is also etched from the above and the taper of the second insulating layer can be made looser.

The second insulating layer may be formed such that the thickness of the second insulating layer is greater than or equal to that of the first insulating layer and is less than or equal to approximately 600 nm.

By forming the second insulating layer in a manner such that the thickness of the second insulating layer is greater than or equal to the thickness of the first insulating layer, the taper of the second insulating layer can be made looser than that of the first insulating layer. Moreover, by forming the second insulating layer in a manner such that the thickness thereof is less than or equal to 600 nm, etching time required for the formation of the contact hole can be controlled, so that spreading of the contact hole can be properly restricted.

The first metal layer can be formed thicker than the first insulating layer. By forming the first metal layer thicker than the first insulating layer, it is possible that the first metal layer is formed without the occurrence of any severance even when the overhang is formed at the boundary between the first and second insulating layers at the contact hole. As a result, the formation of whiskers on the first metal layer can be prevented, so that no short circuit is caused between this layered structure of wire(s) and other electrodes.

The above-described layered structure of wire(s) can be used for a semiconductor device including a semiconductor layer provided between a substrate and the first insulation layer, and a gate electrode provided in a position different from a spot where the contact hole is formed over the first insulating layer. In that case, the first insulating layer functions as a gate insulating film, and the second insulating layer functions as a gate insulating film or an interlayer insulating film. The contact hole may be formed in such a manner that the first and second insulating layers are penetrated through by the contact hole in order that the layered structure of wire(s) is connected to the semiconductor layer.

According to the present invention, there is provided a method of manufacturing a layered structure of wire(s), and the method comprises: forming a contact hole in an insulating film in which a first insulating layer and a second insulating layer made of different material from each other are stacked in this order, by etching with a predetermined etchant; forming a first metal layer which is made of a refractory metal, in the contact hole; forming a wiring layer, on the first metal layer, which is made of a metal whose resistance is lower than that of the refractory metal; and forming a second metal layer made of a refractory metal, on the wiring layer, so as to be thicker than the first insulating layer.

The forming the contact hole may be such that the etching is performed by using an etchant whose etching rate for the first insulating layer is higher than that for the second insulating layer.

According to the present invention, there is provided a display apparatus which includes any one of the layered structure of wire(s) described above and an optical element having at least an anode, a luminous element layer and a cathode that are provided above the layered structure of wire(s).

According to the present invention, there is provided a display apparatus which includes: a layered structure of wire(s) provided in a contact hole formed in an insulating film in which a first insulating layer and a second insulating layer made of different material from each other are stacked in this order; and an optical element, formed over the layered structure of wire(s), which has at least an anode, a luminous element layer and a cathode, wherein the layered structure of wire(s) includes: a first metal layer which is made of a refractory metal; a wiring layer, formed on the first metal layer, which is made of a metal whose resistance is lower than that of the refractory metal; and a second metal layer, formed on the wiring layer, which is formed to be thicker than the first insulating layer.

By forming the second metal layer thicker than the first insulating layer, it is possible that the second metal layer is formed without the occurrence of any severance even when an overhang is formed at the boundary between the first and second insulating layers at the contact hole. As a result, the formation of whiskers on the second metal layer can be prevented, so that no short circuit is caused between this layered structure of wire(s) and an electrode of the optical element provided thereabove. Especially when the cathode of the optical element is formed commonly for a plurality of pixels of the display apparatus, the prevention of short circuit between the layered structure of wire(s) and the cathode can significantly reduce the probability of the display apparatus rendered defective.

It is to be noted that any arbitrary combination of the above-described structural components, and expressions changed between a method and an apparatus are all effective as and encompassed by the present embodiments.

Moreover, this summary of the invention does not necessarily describe all necessary features so that the invention may also be sub-combination of these described features.

DETAILED DESCRIPTION OF THE INVENTION

The invention will now be described based on preferred embodiments which do not intend to limit the scope of the present invention but exemplify the invention. All of the features and the combinations thereof described in the embodiment are not necessarily essential to the invention.

First Embodiment

Figure 1:
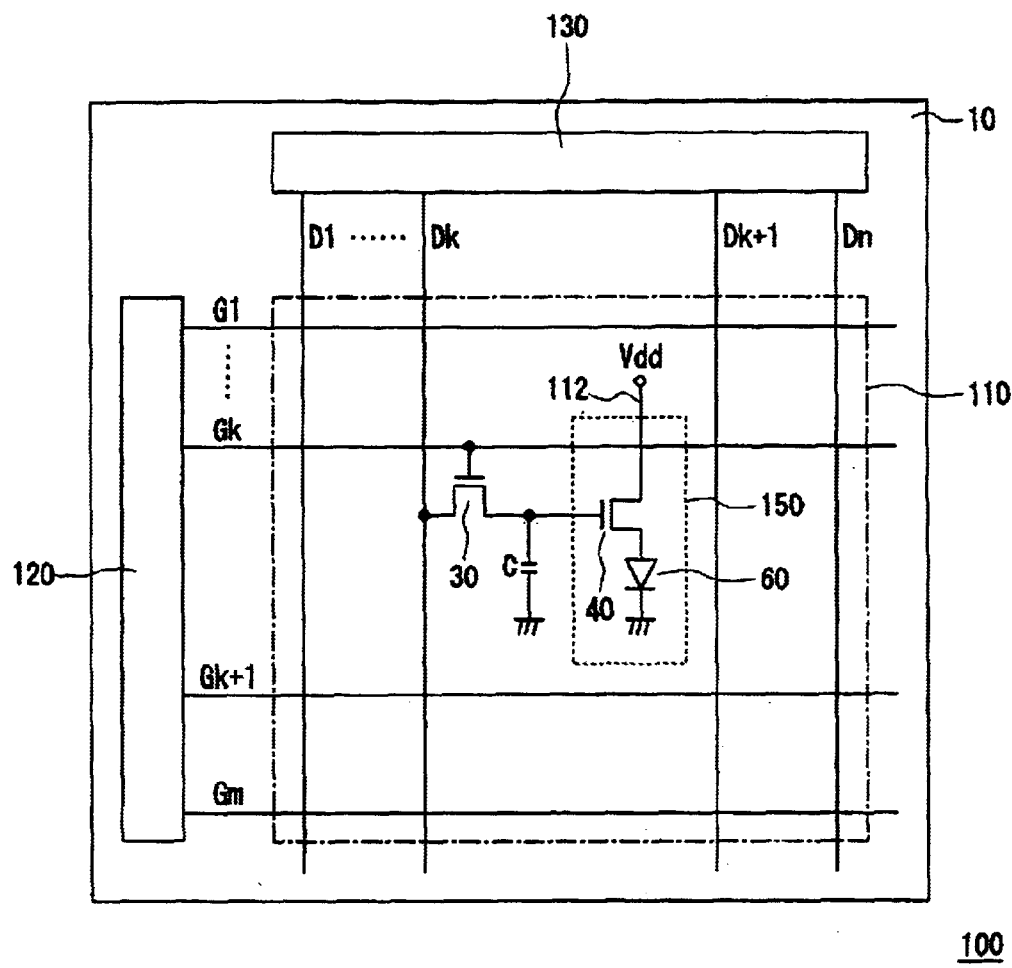
FIG. 1 is a plan view showing part of a display apparatus.

A layered structure of wire(s) according to a first embodiment of the present invention is used for a TFT which drives a display apparatus including an organic EL element. FIG. 1 is a plan view showing part of this display apparatus. A display apparatus 100 includes a display region 110, indicated by a dashed line in FIG. 1, on an insulating substrate 10, and peripheral drive circuits 120 and 130 which drive the TFT of the display region. A plurality of scanning lines G1 to Gm are connected to the peripheral drive circuit 120, and a plurality of data lines D1 to Dn are connected to the peripheral drive circuit 130.

Referring to FIG. 1, shown in the display region 110 is a circuit diagram for a display pixel in the vicinity of a cross-point of the scanning line Gk and the data line Dk. This display pixel includes an organic EL element 60, a first TFT 30, a second TFT 40 and a capacitor C.

A gate electrode in the first TFT 30 is connected to the scanning line Gk, a source electrode (or a drain electrode) in the first TFT 30 is connected to the data line Dk, and the drain electrode (or the source electrode) in the first TFT 30 is connected to a gate electrode in the second TFT 40 and one of electrodes in the capacitor C.

The gate electrode in the second TFT 40 is connected to the drain electrode (or the source electrode) in the TFT 30. The source electrode in the TFT 40 is connected to an anode of the organic EL element 60, and the drain electrode in the TFT 40 is connected to a power supply line 112. A voltage required for actual light emission of the organic EL element 60 is supplied to the power supply line 112. One of the electrodes of the capacitor C is connected to the drain electrode (or source electrode) in the first TFT 30 and the gate electrode in the second TFT 40. The other of the electrodes of the capacitor C is grounded. The anode of the organic EL element 60 is connected to the source electrode in the second TFT 40, and a cathode of the organic EL element 60 is grounded.

Figure 2:
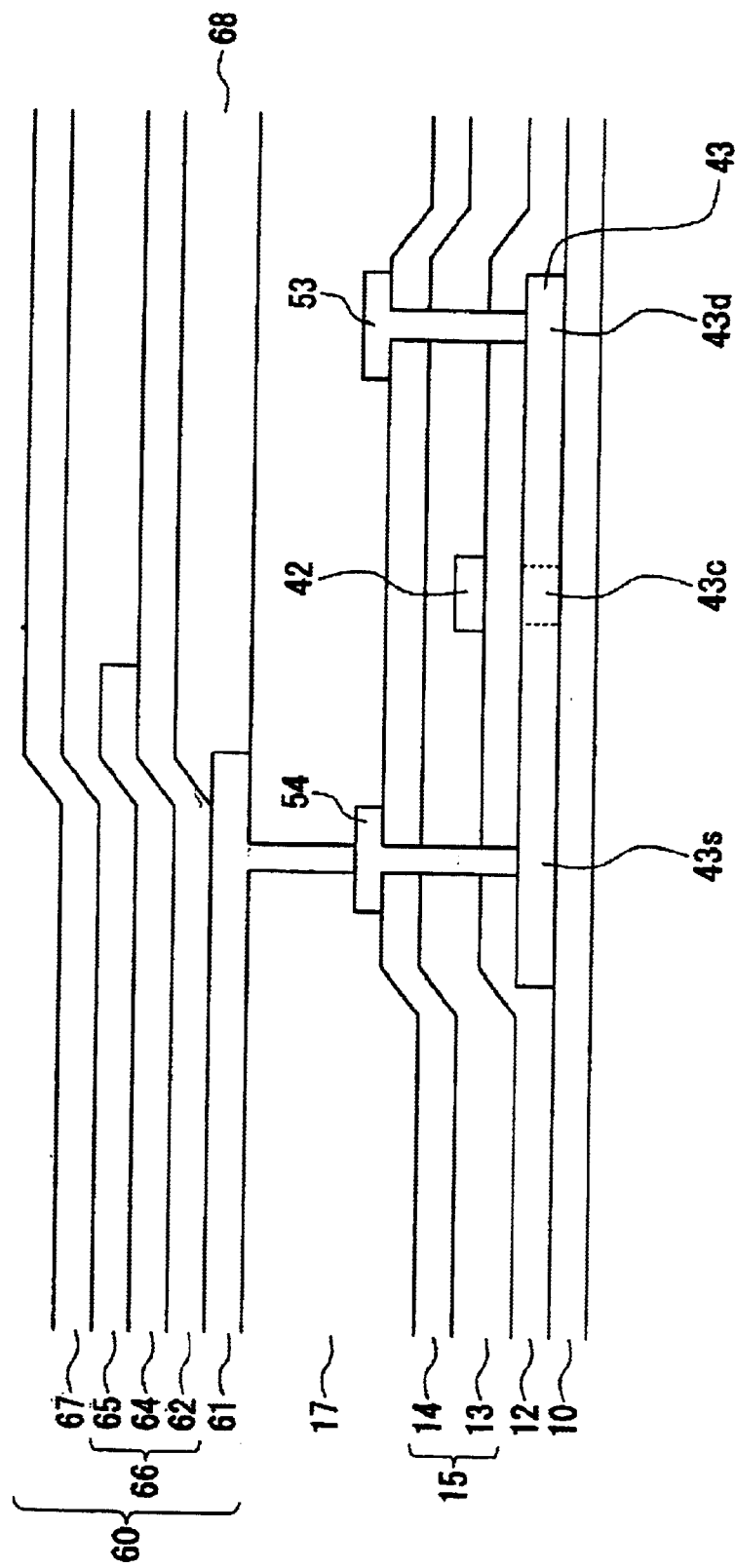
FIG. 2 is a cross-sectional view of a region indicated and enclosed by a broken line in a display pixel shown in FIG. 1.

FIG. 2 is a cross-sectional view of a region 150 enclosed by a broken line shown in FIG. 1. Referring to FIG. 2, an active layer 43 is formed on an insulating substrate 10 made of glass, quartz or the like. The active layer 43 is made of a polycrystalline silicon (p-Si) film having been polycrystallized by laser irradiation to amorphous silicon (a-Si) film. In the active layer 43, a source 43s and a drain 43d are provided on both sides of a channel 43c.

Over the active layer 43 is formed the gate insulating film 12, over which is then formed the gate electrode 42. The gate electrode 42 is made of a refractory metal such as chromium and molybdenum. The gate electrode 42 is connected to the source in the first TFT 30. In the active layer 43, the channel 43c is formed under the gate electrode 42.

Over the whole surface of the gate insulating film 12 and the gate electrode 42 is formed the interlayer insulating film 15. A contact holes formed in relation to the drain 43d and the source 43s are filled with a metal such as aluminum to form the drain electrode 53 and the source electrode 54. A method of forming the contact hole, the drain electrode 53 and the source electrode 54 will be described later.

Over the whole surface of the interlayer insulating film 15, the drain electrode 53 and the source electrode 54 is formed a planarized insulating film 17 made of, for example, an organic resin. On the planarized insulating film 17 is formed the organic EL element 60. The organic EL element 60 has a structure where an anode 61, a light emitting element layer 66 and a cathode 67 are deposited in sequence. The anode 61 is connected to the source 43s via a contact hole formed in relation to the source electrode 54 in the planarized insulating film 17. On the anode 61 is formed an insulating film 68. The insulating film 68 is formed for preventing short-circuit between the cathode 67 and the anode 61 caused by a break in a light emitting element layer 66 due to a step or level difference generated from a thickness of the anode 61.

Examples of a material for the anode 61 include Indium-Tin-Oxide (ITO), tin oxide ($SnO_2$) and indium oxide ($In_2O_3$) Generally, ITO is used because of its hole-injection effectiveness and a low surface resistance. Examples of a material for the cathode 67 include an aluminum alloy containing a trace amount of lithium, a magnesium-indium alloy, and a magnesium-silver alloy. The light emitting element layer 66 has a structure where a hole transport layer 62, a light-emitting layer 64 and an electron transport layer 65 are deposited in sequence. Examples of a material for the hole transport layer 62 include 4,4',4"-tris(3-methylphenylphenylamino)triphenylamine (MTDATA), N,N'-Di(naphthalene-1-yl)-N,N'-diphenyl-benzidine (NPB) and N,N'-diphenyl-N,N'-di(3-methylphenyl)-1,1'-biphenyl-4,4'-diamine(TPD). Examples of a material for the light-emitting layer 64 include a bis (benzoquinolinolato) beryllium complex comprising a quinacridone derivative (bis(10-hydroxybenzo[h]quinolinolato)beryllium:Bebq2) and an aluminum-quinolene complex (Alq3). Examples of a material for the electron transport layer 65 include Bebq2 and Alq3.

The hole transport layer 62, the electron transport layer 65 and the cathode 67 are formed such that they are shared by a plurality of the organic EL elements 60 in each pixel. The light-emitting layer 64 is formed as an island in response to the anode 61.

The above configurations and materials for a pixel are only illustrative and do not limit the scope of the present invention. For example, the first TFT 30 and the second TFT 40 may be of an n-channel type, a p-channel type or even a combination of an n-channel and a p-channel types. The organic EL element 60 may have a structure where the anode 61, the light emitting element layer 66 and the cathode 67 are deposited in reverse. An intervening layer may be formed between layers.

There will be described operation for light-emitting of the organic EL element 60 in a pixel thus configured. On applying a gate signal from the scanning line Gk to the gate electrode in the first TFT 30, the first TFT 30 is turned on. Thus, the charge applied from the source (or drain) electrode in the first TFT 30 is stored in the capacitor C while being applied to the gate electrode in the second TFT 40. To the organic EL element 60, a current in response to the voltage applied to the gate electrode in the second TFT 40 is fed from the driving power line 112.

In the organic EL element 60, holes injected from the anode 61 and electrons injected from the cathode 67 are recombined inside of the light-emitting layer 64 to excite the organic molecules constituting the light-emitting layer 64 for generating excitons. In the course of energy-emitting inactivation of the excitons, the light-emitting layer 64 emits a light, which is discharged via the transparent anode 61 and is perceived as light-emission of the organic EL element 60.

Features of the present invention will be described according to the pixel structure for the organic EL display illustrated above. In one embodiment of the present invention, the drain electrode 53 and the source electrode 54 have a multilayer structure including a wiring layer made of a low resistance metal and protective metal layers made of refractory metal in which the wiring layer is placed between the protective metal layers. As for the first embodiment, the protective meal layers are formed to be thicker than the gate insulating film 12.

FIGS. 3A to 3D are a series of processes showing a method of forming the contact hole, drain electrode 53 and source electrode 54. In this first embodiment of the present invention, a gate insulating film 12 is made of a silicon oxide ($SiO_2$) formed using a CVD method. An interlayer insulating film 15 comprises a first interlayer insulating film 13 which is a silicon nitride (SiN) formed using the CVD method, and a second interlayer insulating film 14 which is a silicon oxide ($SiO_2$) formed also using the CVD method. These first interlayer insulating film 13 and second interlayer insulating film 14 are preferably formed in succession using the CVD method without being taken out of a vacuumed condition. In this manner, dust and other foreign matter in the air are prevented from adhering to the interface between the two films.

Figure 3A:
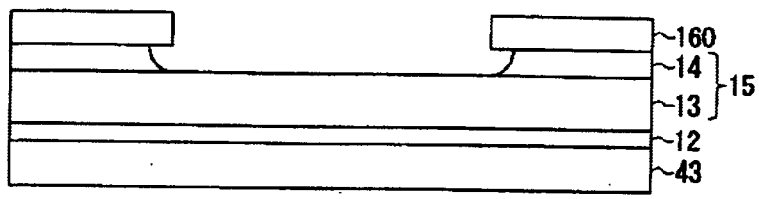
FIGS. 3A to 3D illustrate a process of forming a contact hole, a source electrode and a drain electrode.

A method of forming the contact hole is described hereinbelow. Etching is performed with a buffered hydrofluoric acid, using as a mask a resist layer 160 that has an opening in a position corresponding to the source 43s (or the drain 43d) of the active layer 43 (see FIG. 2). First, as shown in FIG. 3A, the second interlayer insulating film 14 is removed by etching. At this time, the second interlayer insulating film 14 under the resist layer 160 is also under-etched.

Figure 3B:
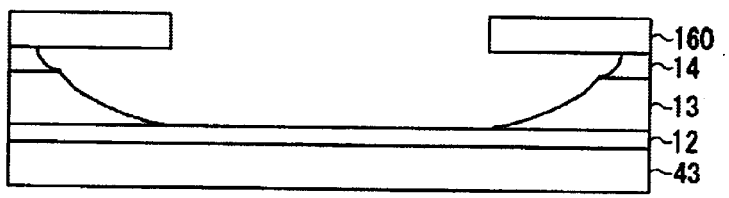

Next, as shown in FIG. 3B, the first interlayer insulating film 13 is removed by etching. At this time, the second interlayer insulating film 14, whose etching rate is greater than that of the first interlayer insulating film 13, when using the buffered hydrofluoric acid, is further etched in the lateral direction while the first interlayer insulating film 13 is being etched. As a result, the first interlayer insulating film 13 is etched from above, too, so that a taper angle of the first interlayer insulating film 13 can be made smaller.

Figure 3C:
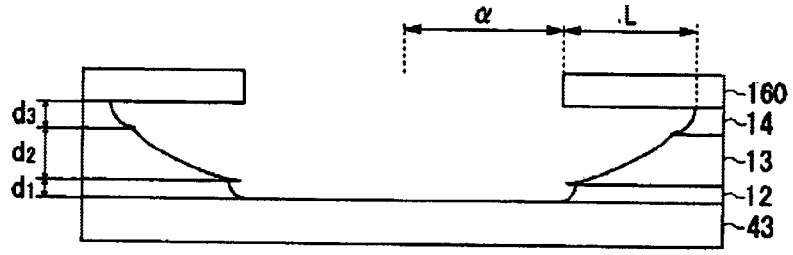

As shown in FIG. 3C, on completion of the vertical etching of the first interlayer insulating film 13, the etching of the gate insulating film 12 starts. The gate insulating film 12 is etched not only in the vertical direction but also in the horizontal direction. At this time, the first interlayer insulating film 13 is also etched, but the gate insulating film 12, whose etching rate is greater than that of the first interlayer insulating film 13 when using the buffered hydrofluoric acid, is further etched in the horizontal direction than the first interlayer insulating film 13. As a result, as shown in the figure, an overhang may be formed at a boundary between the first interlayer insulating film 13 and the gate insulating film 12. An overhang meant here is a formation on the first interlayer insulating film 13 protruding beyond the gate insulating film 12 toward the center of the contact hole at the boundary between the first interlayer insulating film 13 and the gate insulating film 12. In this manner, a contact hole penetrating the gate insulating film 12, the first interlayer insulating film 13 and the second interlayer insulating film 14 is formed in a position corresponding to the drain 14d (or the source 14s) of the active layer 43.

Figure 3D:
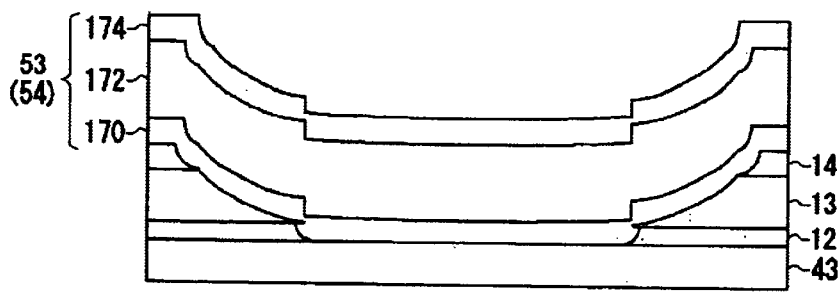

The resist layer 160 is removed, and then, as shown in FIG. 3D, a first protective metal layer 170 made of a refractory metal, a wiring layer 172 made of a low-resistance metal and a second protective metal layer 174 made of a refractory metal are formed in succession all over the contact hole and the second interlayer insulating film 14, using a sputtering technique. At this time, the second protective metal layer 174 is formed thicker than the gate insulating film 12. Then the first protective metal layer 170, the wiring layer 172 and the second protective metal layer 174 are etched to form the drain electrode 53 and the source electrode 54.

In this first embodiment, by forming the second protective metal layer 174 thicker than the gate insulating film 12, it is possible that the second protective metal layer 174 is formed without the occurrence of any severance even when the overhang is formed at the boundary between the first interlayer insulating film 13 and the gate insulating film 12. As a result, the occurrence of whiskers at the drain electrode 53 and the source electrode 54 can be suppressed. Hence, as shown in FIG. 2, no short circuit will be caused even when the cathode 67 of the organic EL element 60 is formed all over above the drain electrode 53 and the source electrode 54, thus realizing a stable manufacture of the display apparatus 100 (shown in FIG. 1).

Moreover, in the present embodiment, the first protective metal layer 170 is also formed thicker than the gate insulating film 12. This will suppress the occurrence of whiskers on the drain electrode 53 and the source electrode 54. Hence, no short circuit will be caused between the drain electrode 53 and source electrode 54 and the other electrodes, thus realizing a stable manufacture of the display apparatus 100.

Furthermore, in the present embodiment, the first interlayer insulating film 13 is formed with a thickness larger than that of the gate insulating film 12. As a result, the time required for etching the first interlayer insulating film 13 from above becomes longer, thereby making it possible to have a moderate taper angle for the first interlayer insulating film 13. Moreover, since the second interlayer insulating film 14 made of a material whose etching rate is higher than that of the first interlayer insulating film 13 when using buffered hydrofluoric acid is formed over the first interlayer insulating film 13, the time required for etching the first interlayer insulating film 13 from above becomes longer, thereby making it possible to have an even more moderate taper angle for the first interlayer insulating film 13.

Moreover, the first interlayer insulating film 13 can be formed in such a manner that a radius of the widest part of a contact hole is smaller than a desired value. For example, according to the present embodiment, the radius of the widest part of the contact hole can be formed to be $(2+\alpha)\mu m$ (where $\alpha$ is the radius of an opening in the resist layer 160, and $\alpha$ is approximately 2 $\mu m$ according to the present embodiment) or smaller. Referring to FIG. 3C, if the thicknesses of the gate insulating film 12 ($SiO_2$), the first interlayer insulating film 13 (SiN) and the second interlayer insulating film 14 ($SiO_2$) are denoted by d1, d2 and d3, respectively, and the etching rates thereof when using the buffered hydrofluoric acid by r1, r2 and r3, respectively, then the total etching time T will be $T=d1/r1+d2/r2+d3/r3$.

A spread L of the contact hole into the second interlayer insulating film 14 will be $L=r3\times T$. Accordingly, the gate insulating film 12, the first interlayer insulating film 13 and the second interlayer insulating film 14 will be formed into thickness such that $L=r3\times T\leq 2$ $\mu m$ (equation 1). In the present embodiment, the gate insulating film 12 and the second interlayer insulating film 14 are both made of $SiO_2$, so it may be possible that $r1\approx r3$. Substituting this into the equation 1 and $T=d1/r1+d2/r2+d3/r3$, obtained is $d2\leq(r2/r3)(2-d1-d3)$. The thickness d2 of the first interlayer insulating film 13 can be determined according to the etching rates r2 and r3 of the first interlayer insulating film 13 and the second interlayer insulating film 14, respectively, when using the buffered hydrofluoric acid and according to the thickness d3 of the second interlayer insulating film 14 and the thickness d1 of the gate insulating film. Normally, the etching rate of an $SiO_2$ film when using the buffered hydrofluoric acid is 3 to 10 times that of an SiN film.

In a case where all the above-mentioned conditions are met, a preferable thickness range of the first interlayer insulating film 13 is 100 to 600 nm. A preferable thickness range of the second interlayer insulating film 14 is 100 to 500 nm. A preferable thickness range of the gate oxide film 12 is 20 to 100 nm. A preferable thickness range of the first protective metal layer 170 is 30 to 120 nm, that of the second protective metal layer 174 is 30 to 120 nm and that of the wiring layer 172 is 30 to 700 nm.

Second Embodiment

Figure 4:
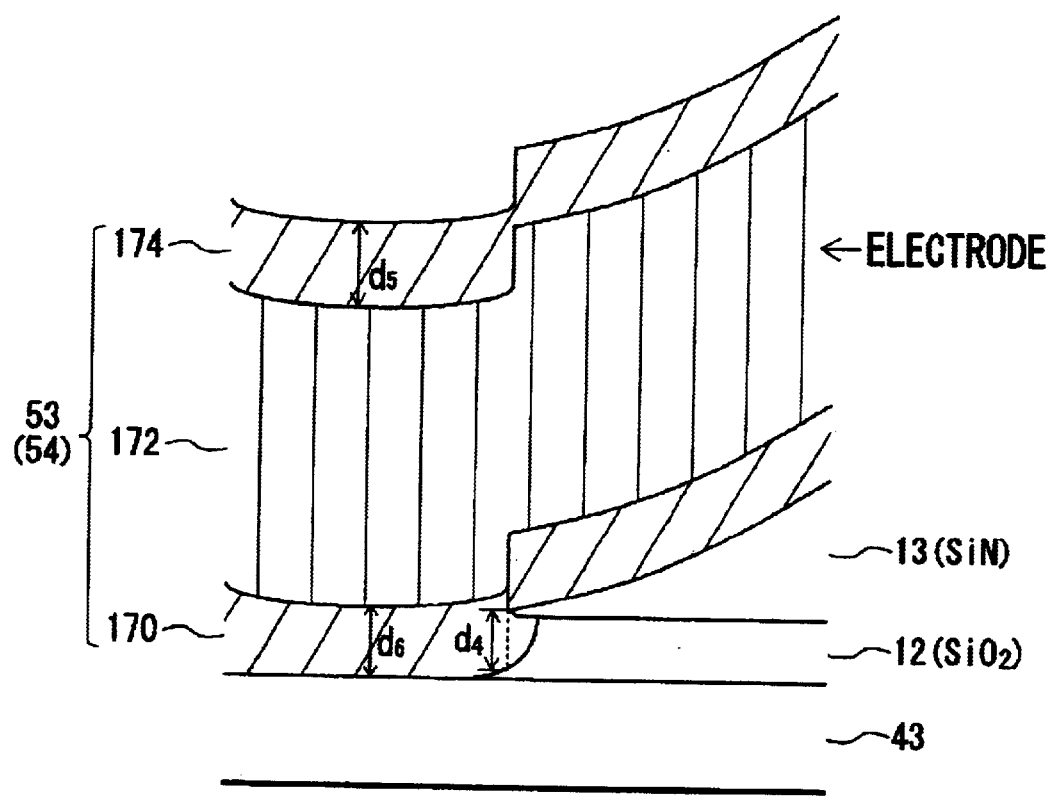
FIG. 4 is a schematic drawing to explain a second embodiment of the present invention.
Figure 5:
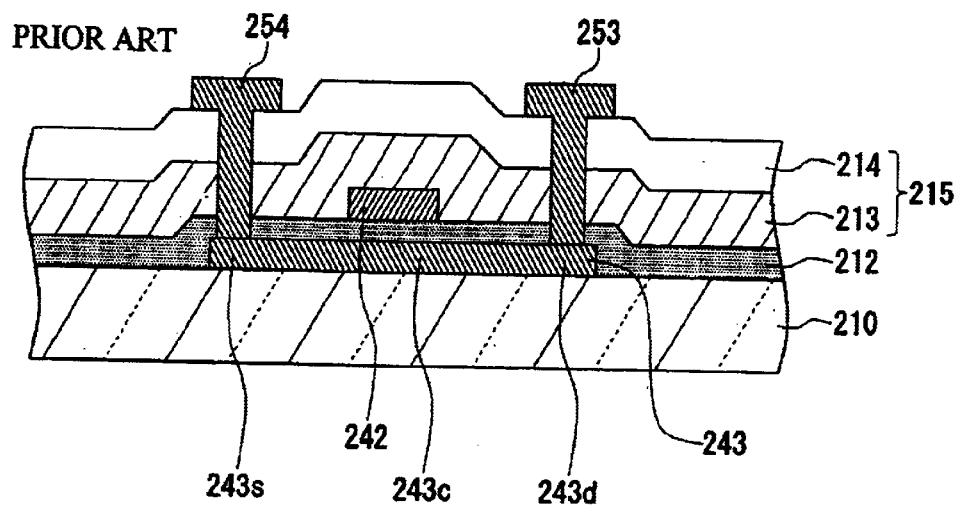
FIG. 5 is a cross-sectional view of a conventional TFT in a display apparatus using an organic EL element.
Figure 6A:
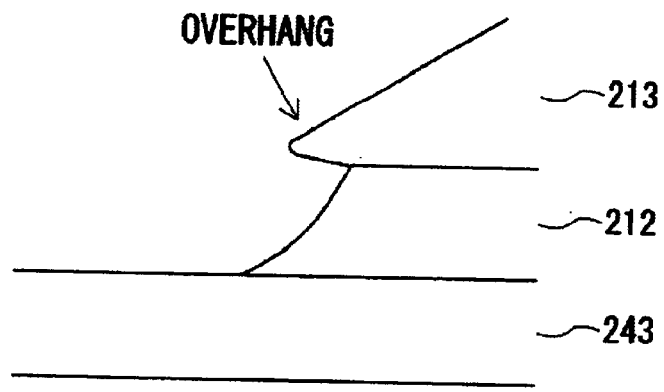
FIG. 6A and FIG. 6B are cross-sectional views of a contact hole in the conventional TFT of the organic EL element.
Figure 6B:
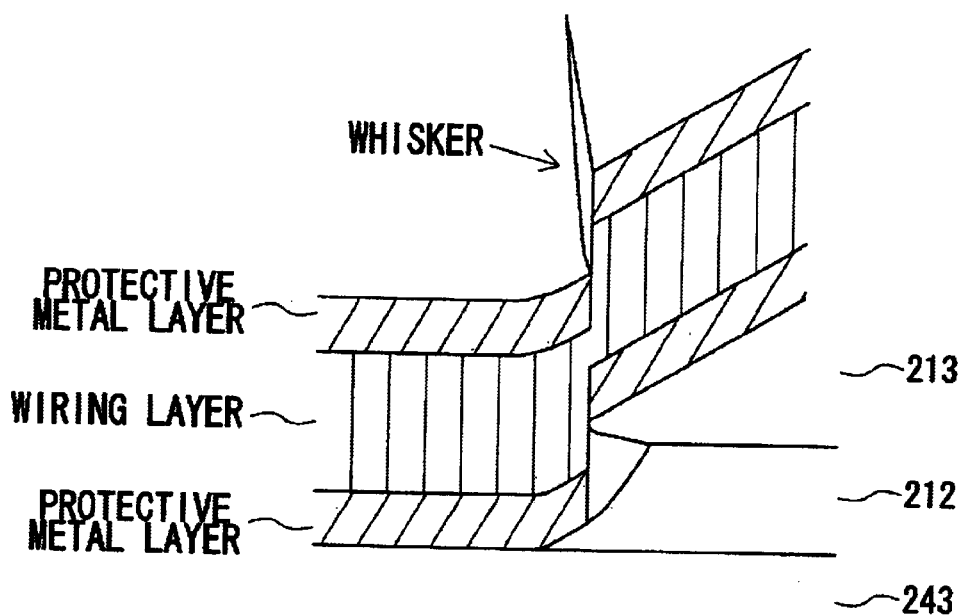

FIG. 4 is a schematic drawing to explain a second embodiment of the present invention.

In the first embodiment, a description was given of a case where the second protective metal layer 174 is formed thicker than the gate insulating film 12. In this second embodiment, however, the second protective metal layer 174 is formed so that film thickness d5 of the second protective metal layer 174 is larger than a distance d4 between the tip of the overhang and the gate insulating film 12 therebelow. Thus, the second protective metal layer 174 will be formed without the occurrence of any severance even when an overhang is formed at the boundary between the first interlayer insulating film 13 and the gate insulating film 12. As a result, the occurrence of whiskers sprouting from the drain electrode 53 and the source electrode 54 can be suppressed. Hence, as shown in FIG. 2, no short circuit is caused when the cathode 67 of the organic EL element 60 is formed all over above the drain electrode 53 and the source electrode 54, thus realizing a stable manufacture of the display apparatus 100.

Moreover, in this second embodiment, the first protective metal layer 170 is also formed so that film thickness d6 of the first protective metal layer 170 is larger than the distance d4 between the tip of the overhang and the gate insulating film 12 therebelow. Thereby, the similar effect is obtained in which the short circuit between the electrodes can be prevented.

In the embodiments described hereinabove, the gate insulating film 12 and the second interlayer insulating film 14 are made of $SiO_2$, but the gate insulating film 12 and the second interlayer insulating film 14 may be made of SiON (silicon oxynitride). The layered structure of wire(s) according to the present invention and the manufacturing method thereof can be used effectively when, in forming a hole through films in the multilayer structure by etching with a predetermined etchant, the etching rate of the material constituting a lower layer in the multilayer structure is larger than that of the material constituting an upper layer thereof.

Moreover, in the above embodiments, the first interlayer insulating film 13 is made of SiN, but a layer made of SiN, for example, may be provided as a second gate insulating film over the gate insulating film 12.

Although the present invention has been described by way of exemplary embodiments, it should be understood that many changes and substitutions may further be made by those skilled in the art without departing from the scope of the present invention which is defined by the appended claims.

What is claimed is:

1. A layered structure of wire(s) provided in a contact hole formed in an insulating film in which a first insulating layer, a second insulating layer, and a third insulating layer are stacked in this order, wherein said first insulating layer and said second insulating layer are made of different material from each other and said third insulating layer is made of a different material from said second insulating layer, wherein the layered structure of wire(s) including:

a first metal layer;

a wiring layer, formed on said first metal layer, which is made of a metal whose resistance is lower than that of said first metal layer; and a second metal layer formed on said wiring layer which is so formed as to be thicker than said first insulating layer.

2. A layered structure of wire(s) according to claim 1, wherein the contact hole is formed in such a manner that said second insulating layer has a taper slower than that of said first insulating layer.

3. A layered structure of wire(s) according to claim 1, wherein said second insulating layer is formed such that the thickness of said second insulating layer is greater than or equal to that of said first insulating layer and is less than or equal to approximately 600 nm.

4. A layered structure of wire(s) according to claim 1, wherein said first metal layer is formed thicker than said first insulating layer.

5. A layered structure of wire(s) according to claim 1, wherein said first metal layer is made of a refractory metal and said second metal layer is made of a refractory metal.

6. A layered structure of wire(s) according to claim 5, wherein at least either one of said first metal layer and said second metal layer is made of molybdenum.

7. A layered structure of wire(s) according to claim 1, wherein said contact hole is formed by using a predetermined etchant, said first insulating layer and said third insulating layer having higher etching rates than that of said second insulating layer when using said predetermined etchant.

8. A layered structure of wire(s) provided in a contact hole formed in an insulating film in which a first insulating layer, a second insulating layer, and a third insulating layer are stacked in this order, wherein said first insulating layer and said second insulating layer are made of different material from each other and said third insulating layer is made of a different material from said second insulating layer, wherein the layered structure of wire(s) including:

a first metal layer;

a wiring layer, formed on said first metal layer, which is made of a metal whose resistance is lower than that of said first metal layer; and a second metal layer formed on said wiring layer which is so formed as to be thicker than a distance between an overhang and said first insulating layer therebelow, wherein said contact hole is formed by using a predetermined etchant, and in said second insulating film there is formed the overhang which is protruded beyond said first insulating film toward the center of said contact hole.

9. A layered structure of wire(s) according to claim 8, wherein said contact hole is formed in such a manner that said second insulating layer has a taper slower than that of said first insulating layer.

10. A layered structure of wire(s) according to claim 8, wherein said second insulating layer is formed such that the thickness of said second insulating layer is greater than or equal to that of said first insulating layer and is less than or equal to approximately 600 nm.

11. A layered structure of wire(s) according to claim 8, wherein said first metal layer is formed thicker than said first insulating layer.

12. A layered structure of wire(s) according to claim 8, wherein said first metal layer is made of a refractory metal and said second metal layer is made of a refractory metal.

13. A layered structure of wire(s) according to claim 12, wherein at least either one of said first metal layer and said second metal layer is made of molybdenum.

14. A layered structure of wire(s) according to claim 8, wherein said first insulating layer and said third insulating layer have higher etching rates than that of said second insulating layer when using said predetermined etchant.

15. A layered structure of wire(s) provided in a contact hole formed in an insulating film in which a first insulating layer, a second insulating layer, and a third insulating layer are stacked in this order, wherein said first insulating layer and said second insulating layer are made of different material from each other and said third insulating layer is made of a different material from said second insulating layer, wherein the layered structure of wire(s) including:

a first metal layer;

a wiring layer, formed on said first metal layer, which is made of a metal whose resistance is lower than that of said first metal layer; and a second metal layer formed on said wiring layer which is formed to have thickness such that any severance does not occur due to a level difference caused by different etching rates of said first insulating layer and said second insulating layer when using a predetermined etchant, wherein said contact hole is formed by using said predetermined etchant.

16. A layered structure of wire(s) according to claim 15, wherein said contact hole is formed in such a manner that said second insulating layer has a taper slower than that of said first insulating layer.

17. A layered structure of wire(s) according to claim 15, wherein said second insulating layer is formed such that the thickness of said second insulating layer is greater than or equal to that of said first insulating layer and is less than or equal to approximately 600 nm.

18. A layered structure of wire(s) according to claim 15, wherein said first metal layer is formed thicker than said first insulating layer.

19. A layered structure of wire(s) according to claim 15, wherein said first metal layer is made of a refractory metal and said second metal layer is made of a refractory metal.

20. A layered structure of wire(s) according to claim 19, wherein at least either one of said first metal layer and said second metal layer is made of molybdenum.

21. A layered structure of wire(s) according to claim 15, wherein said first insulating layer and said third insulating layer have higher etching rates than that of said second insulating layer when using said predetermined etchant.

* * * * *